United States Patent
Lahner et al.

(10) Patent No.: US 8,851,733 B2
(45) Date of Patent: Oct. 7, 2014

(54) LIGHT SIGNAL TRANSMITTER AND LIGHT RECEIVER FOR AN OPTICAL SENSOR

(75) Inventors: Frank Lahner, Erlangen (DE); Thomas Völkel, Altdorf (DE)

(73) Assignee: Siemens Aktiengesellschaft, Munich (DE)

( * ) Notice: Subject to any disclaimer, the term of this patent is extended or adjusted under 35 U.S.C. 154(b) by 28 days.

(21) Appl. No.: 13/504,987

(22) PCT Filed: Oct. 28, 2010

(86) PCT No.: PCT/EP2010/066318
§ 371 (c)(1),
(2), (4) Date: Apr. 30, 2012

(87) PCT Pub. No.: WO2011/051370
PCT Pub. Date: May 5, 2011

(65) Prior Publication Data
US 2012/0218766 A1 Aug. 30, 2012

(30) Foreign Application Priority Data

Oct. 29, 2009 (DE) .................. 10 2009 051 188

(51) Int. Cl.
*F21V 7/04* (2006.01)
*H05K 3/46* (2006.01)
*G01V 8/10* (2006.01)
*H05K 1/14* (2006.01)
*H05K 1/02* (2006.01)

(52) U.S. Cl.
CPC *G01V 8/10* (2013.01); *H05K 1/144* (2013.01); *H05K 3/4697* (2013.01); *H05K 1/0274* (2013.01); *H05K 2201/2054* (2013.01); *H05K 2201/10106* (2013.01); *H05K 2201/042* (2013.01)
USPC .............................. 362/612; 362/245; 385/14

(58) Field of Classification Search
USPC .......... 362/235, 612, 245; 385/12, 14, 15, 31, 385/33, 47, 93, 101; 174/260
See application file for complete search history.

(56) References Cited

U.S. PATENT DOCUMENTS 5,675,143 A 10/1997 Heimlicher
6,731,882 B1 * 5/2004 Althaus et al. ............... 398/139
(Continued)

FOREIGN PATENT DOCUMENTS

DE 4407967 10/1995
DE 19858247 1/2000
(Continued)

OTHER PUBLICATIONS

International Search Report for PCT/EP2010/066318, mailed Jan. 27, 2012.
(Continued)

*Primary Examiner* — Hargobind S Sawhney
(74) *Attorney, Agent, or Firm* — Staas & Halsey LLP

(57) ABSTRACT

A light signal transmitter and a light receiver for an optical sensor may be used for an industrial automation system. The light signal transmitter has a semiconductor-based light source for generating light. The semiconductor-based light source is disposed in an installation space between outer layers of a multi-layer circuit board. The light emission direction of the semiconductor-based light source is oriented substantially parallel to the layers of the printed circuit board. A deflection unit deflects the light emitted by the semiconductor-based light source in a direction substantially perpendicular to the layers of the printed circuit board. In the case of the light receiver, a light sensor is provided in place of the light source. Such optical sensors can be designed in a particularly flat and installation-friendly manner.

19 Claims, 1 Drawing Sheet

(56) References Cited

U.S. PATENT DOCUMENTS

| | | | |
|---|---|---|---|
| 6,839,476 B2 * | 1/2005 | Kim et al. | 385/14 |
| 7,120,325 B1 * | 10/2006 | Uchida | 385/14 |
| 7,149,389 B2 * | 12/2006 | Yoon et al. | 385/43 |
| 7,228,020 B2 * | 6/2007 | Weigert | 385/14 |
| 7,541,058 B2 * | 6/2009 | Chan et al. | 427/163.2 |
| 7,980,747 B2 * | 7/2011 | Vissenberg et al. | 362/612 |
| 8,129,731 B2 * | 3/2012 | Vissenberg et al. | 257/88 |
| 8,417,078 B2 * | 4/2013 | Riester et al. | 385/47 |
| 8,422,836 B2 * | 4/2013 | Riester et al. | 385/14 |
| 2002/0134138 A1 | 9/2002 | Philipp et al. | |
| 2004/0109627 A1 | 6/2004 | Kim et al. | |
| 2004/0136099 A1 | 7/2004 | Kim et al. | |
| 2006/0250813 A1 | 11/2006 | Lippmann et al. | |
| 2009/0310905 A1 | 12/2009 | Riester et al. | |
| 2010/0142896 A1 | 6/2010 | Riester et al. | |
| 2011/0135248 A1 * | 6/2011 | Langer et al. | 385/14 |

FOREIGN PATENT DOCUMENTS

| | | |
|---|---|---|
| DE | 10308085 | 10/2003 |
| DE | 102004028814 | 1/2006 |
| DE | 10 2009 051 188.1 | 10/2009 |
| JP | 9-318853 | 12/1997 |
| JP | 10-256648 | 9/1998 |
| JP | 2008-84396 | 4/2008 |
| WO | 2007/128021 | 11/2007 |
| WO | 2007/128022 | 11/2007 |
| WO | 2009/036478 | 3/2009 |
| WO | PCT/EP2010/066318 | 10/2010 |

OTHER PUBLICATIONS

German Office Action for German Priority Patent Application No. 10 2009 051 188.1, Issued on Jun. 10, 2010.

Japanese Office Action mailed Mar. 11, 2014 in corresponding Japanese Application No. 2012-535820.

* cited by examiner

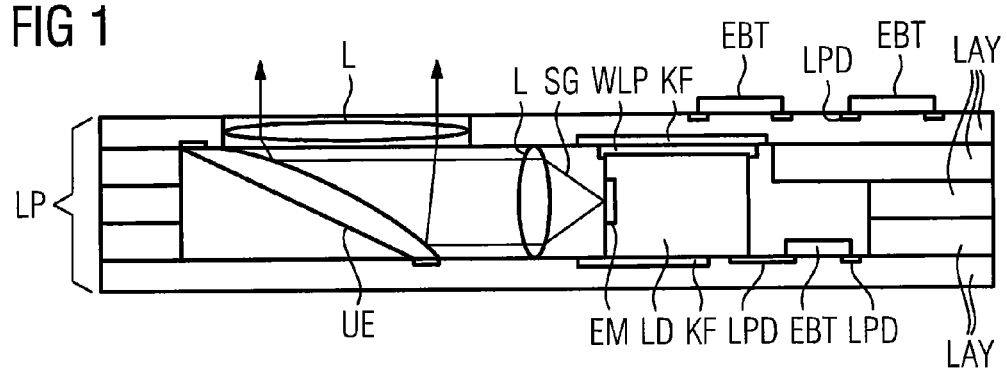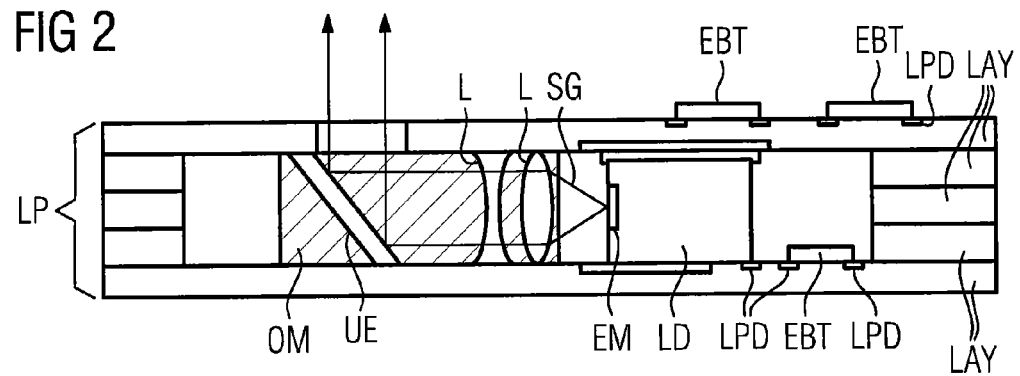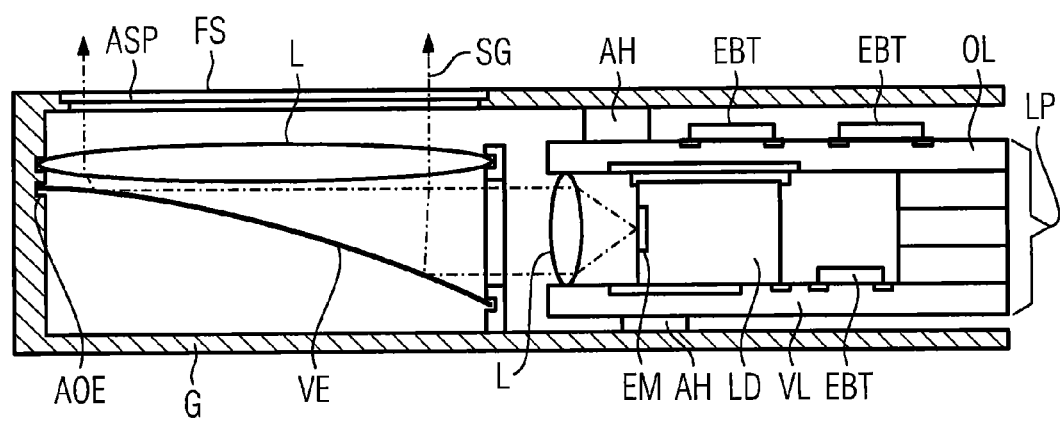

LIGHT SIGNAL TRANSMITTER AND LIGHT RECEIVER FOR AN OPTICAL SENSOR

CROSS REFERENCE TO RELATED APPLICATIONS

This application is based on and hereby claims priority to International Application No. PCT/EP2010/066318 filed on Oct. 28, 2010 and German Application No. 10 2009 051 188.1 filed on Oct. 29, 2009, the contents of which are hereby incorporated by reference.

BACKGROUND

The invention relates to a light signal transmitter for an optical sensor and to a light receiver Optical sensors are used in many non-industrial and primarily also industrial applications, in particular in industrial automation arrangements, in a wide variety of designs for detecting the presence or absence of objects or persons. Known exemplary embodiments are light barriers or light probes, in which a light beam is emitted by a light signal transmitter, that is to say a light source, and is received by a photocell, a light-sensitive semiconductor component or a similar sensor element; in this case, the term light probe denotes "reflected light barriers" in which light source and receiver (sensor) are integrated with one another in a single device.

In order to construct a system which is as robust and independent of stray light as possible and which can monitor even relatively large distances (detection ranges), beam shaping of the light has to be effected at the light signal transmitter (transmitter). For this purpose, the actual light source (LED; semiconductor laser diode) is regularly provided with an optical assembly, for example with a lens or a lens system ("objective"). A comparatively small light spot is thus generated which ensures high switching and repeat accuracy upon the entry of objects into the light beam and reduces mutual influencing of systems of identical type installed alongside one another (that is to say improves the signal-to-noise ratio), and the possible detection distance (distance) is increased. Such a constructional embodiment of the light signal transmitter, by virtue of the optical assembly disposed upstream, gives rise to arrangements having comparatively large dimensions or else arrangements having housings from which the optical assemblies project. In the case of confined space conditions, however, flat housing dimensions are demanded, which cannot be realized by the known arrangements. The dimensions of known light receivers (light detectors, "optical receivers") which receive the light emitted by the light signal transmitters of the optical sensors are likewise disadvantageous, since they, too, cannot be constructed in an arbitrarily flat fashion by virtue of optical assemblies disposed upstream.

SUMMARY

Therefore, one possible object is to propose a light signal transmitter designed to be as flat as possible and a light receiver designed in the same fashion for optical sensors.

The inventors propose that a semiconductor-based light source, preferably a semiconductor laser diode, is integrated into a printed circuit board, wherein the light from the light source is emitted parallel to a plane of the printed circuit board, and wherein an element for beam deflection is provided in or alongside the printed circuit board. A construction of identical type is proposed for the light receiver (light detector).

The solution to the problem provides, in particular, a light signal transmitter for an optical sensor, in particular for a light barrier or a light probe for an industrial automation system, wherein a semiconductor-based light source is used for generating the light. In this case, the semiconductor-based light source is arranged in a structural space between outer layers of a multilayer printed circuit board, wherein the light exit direction of the semiconductor-based light source is oriented substantially parallel to the layers of the printed circuit board, and wherein provision is made of a deflection unit for deflecting the light emitted by the semiconductor-based light source in a substantially perpendicular direction with respect to the layers of the printed circuit board. Such an arrangement makes it possible to produce a light signal transmitter of very flat design. According to the same structural principle, a light receiver likewise of flat design can also be produced as a receiver for an optical sensor arrangement, wherein, instead of the semiconductor-based light source, a semiconductor-based light sensor (CCD chip, CMOS chip) is used, the light-sensitive area of which is oriented substantially perpendicular to the layers of the printed circuit board. In this case, the deflection unit deflects the light to be detected by the sensor from a direction of incidence running perpendicular to the printed circuit board into the plane of the printed circuit board, such that the light can impinge on the light-sensitive sensor.

The features and advantages described for the light signal transmitter analogously also apply to corresponding configurations of a light receiver according to the invention.

Advantageously, the deflection element is arranged together with the semiconductor-based light source in the (one) structural space. As a result, the complete light signal transmitter can be produced and mounted as a single component or as a single section of a printed circuit board also used for a different purpose, without the printed circuit board with the light source having to be aligned with the deflection element during mounting of the optical sensor or of the light signal transmitter, or vice versa. This procedure is also advantageous for production because a first lower layer (carrier layer) can be provided with the central layers, the semiconductor-based light source and the deflection element before the topmost layer (upper outer layer) is laminated on last. For the passage of emitted light, the outer layer of the printed circuit board on the light exit side has an opening in the region of the deflection element, which opening can be closed off with a transparent segment, for example a filter disk, for protection against contamination or the like. In an alternative embodiment, the deflection element is arranged outside the structural space and thus also outside the printed circuit board. For this purpose, the printed circuit board then has at the end side an exit opening for the light, wherein the exit opening can also be provided with a transparent closure element. In both cases, the transparent closure element can also be configured as an optical lens or the like in order to shape the beam or to manifest the effect of an optical diaphragm, or can alternatively be configured as an optical filter. It is thus conceivable in the latter case, for example, to color the substantially transparent closure element (color filter) or embody it as a polarization filter (linear polarization filter or circular polarization filter). In these cases, the corresponding light receiver (light detector) can be provided with precisely such filtering, as a result of which better signal-to-noise ratios can be achieved.

Conventional deflection elements are prisms or mirrors. In this case, particularly in the exemplary embodiment of the "mirrors", the reflection surface can be embodied in convex or concave fashion for concentrating or for expanding the light beam. In this case, the curvature need not necessarily be rotationally symmetrical; rather, more complex geometries can also advantageously be used, for example ellipsoids or a so-called saddle shape. This can take account of the circumstance that conventional semiconductor laser diodes emit the light asymmetrically. Such geometries can also be chosen for the reflection layer of prisms.

Advantages during production (mounting) arise if the deflection element and at least one optical lens are combined to form an optical module. Such an optical module, even before it is mounted into the structural space, can also already be connected to the semiconductor-based light source (for example by adhesive bonding), such that, during the arrangement (mounting) of the components in the structural space, the optically active elements no longer have to be aligned with one another anew.

The semiconductor-based light source is advantageously in contact with at least one contact area of the printed circuit board for the purpose of heat dissipation. In this case, an element for heat transfer and for compensation of distances, for example a thermally conductive pad or a thermally conductive paste, can be provided between the contact area of the printed circuit board and a surface of the semiconductor-based light source.

The semiconductor-based light source is advantageously electrically connected to conductor tracks, contact areas or soldering pads of the printed circuit board by bonding ("chip bonding") or by a plated-through hole. The complex soldering or the provision of spring contacts or the like is thus obviated. The contact-making methods proposed are also suitable, in particular, in the cases in which the semiconductor-based light source is used as an unpackaged chip ("die"). Such "non-packaged" elements have particularly small external dimensions and are therefore particularly well suited to mounting in the flat structural space between the outer layers of a printed circuit board.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 1 shows a light signal transmitter comprising a semiconductor-based light source and a deflection element in a structural space between the outer layers of a multilayer printed circuit board, FIG. 2 shows an arrangement which corresponds to FIG. 1 and in which an optical module comprising a deflection element and a plurality of lenses is provided in the structural space, and FIG. 3 shows a light signal transmitter comprising a semiconductor-based light source in a structural space between the outer layers of a multilayer printed circuit board, wherein the deflection element is arranged outside the printed circuit board arrangement.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

FIG. 1 illustrates a light signal transmitter in a sectional illustration. In this case, a printed circuit board LP formed of five layers LAY is illustrated, wherein a structural space for the active elements of the light signal transmitter is provided in a region in which only outer layers LAY are present. A semiconductor-based light source, here: a laser diode LD, is provided as active element. The laser diode LD is electrically connected to a soldering pad LPD of the lower outer layer LAY of the printed circuit board and lies with its housing surfaces on cooling surfaces KF of the printed circuit board LP. In the—relative to FIG. 1—upper region of the laser diode LD, a thermally conductive pad WLP is arranged between the laser diode LD and the cooling surface KF, which thermally conductive pad, alongside heat transfer, also serves for filling a gap between the laser diode LD and the upper layer LAY of the printed circuit board LP.

FIG. 1 reveals further electronic components EBT, which are not necessarily associated with the function of the light signal transmitter. The emitter EM of the laser diode LD is oriented with its surface orthogonally with respect to a base surface of the printed circuit board LP, that is to say that the generated light is emitted parallel to the layers of the printed circuit board (in FIG. 1: toward the left). For focusing the light—a beam path SG is depicted schematically in FIG. 1—lenses L are provided; a schematic illustration is involved here, wherein more complex lens systems can also be used instead of the two lenses L depicted. In the structural space, finally, a mirror is provided as deflection element UE in an oblique position, which mirror deflects the emitted light in a direction perpendicular to the planes of the printed circuit board LP (here: upward). The light emerges through an opening in the upper layer of the printed circuit board LP, wherein the opening in this exemplary embodiment has, as transparent closure element FS ("filter disk"), a further lens L used for beam shaping. In the present exemplary embodiment, the surface of the deflection element UE (here: mirror) is not embodied in planar fashion but rather in curved fashion. As a result, a shaping (focusing) of the emitted light beam is additionally achieved.

The laser diode LD is a "non-packaged" semiconductor component, that is to say that the unpackaged "die" is wired directly to the printed circuit board LP or a soldering pad LPD used as contact area. For this purpose, the technique of "chip bonding" is used here; other contact-making techniques can likewise be used. Instead of a multilayer printed circuit board LP in which the individual layers LAY are adhesively bonded to one another under pressure (lamination), the arrangement according to the proposals can also be constructed from individual stacked printed circuit boards ("printed circuit board stacking").

FIG. 2 shows a light signal transmitter in which the optical elements are combined in an optical module OM. The remaining component parts substantially correspond to the arrangement from FIG. 1, and so the component parts and the reference signs thereof will not be explained again at this juncture. In the—relative to FIG. 2—upper layer LAY of the printed circuit board LP, however, in this case use is not made of a lens as element for beam shaping (focusing), but rather merely of an opening ASP ("cutout"). As a result, the optical module OM, during mounting, does not have to be precisely aligned with the opening ASP or, in an alternative exemplary embodiment, the transparent covering (closure element FS) of the topmost layer LAY of the printed circuit board LP.

FIG. 3 illustrates an embodiment of the light signal transmitter in which only the semiconductor-based light source and, if appropriate, a lens L or a lens system (objective) is integrated in the printed circuit board LP, but not the deflection element UE and, if appropriate, further optical elements. As a result, the optical elements, in particular the deflection element UE, can be given larger dimensions. This solution is particularly advantageous in the cases in which the printed circuit board LP is again installed in a separate housing G with receptacles AOE for the optical elements. Spacers AH in between the housing G and the upper layer OL and respectively the lower layer UL of the printed circuit board LP serve firstly for fixing the printed circuit board LP, and secondly for the precise alignment of the printed circuit board LP and thus of the light emitter EM with the deflection element UE and other external optical elements.

A light receiver (light detector) for an optical sensor can also be constructed analogously to the light signal transmitter illustrated with reference to FIGS. 1 to 3. In this case, a semiconductor-based light detector, for example a CCD sensor or a CMOS sensor, is used instead of the semiconductor-based light source. In this case, the beam path SG of the light is the same, the beam direction being reversed, of course.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. A light signal transmitter for an optical sensor, comprising:
    a multilayer printed circuit board formed from two outer layers and at least one inner layer, each layer extending in a plane such that the outer layers and the at least one inner layer are substantially parallel;
    a semiconductor-based light source for generating light, the semiconductor-based light source being arranged in a structural space between the outer layers of the printed circuit board, the semiconductor-based light source emitting a light beam in a light exit direction, the light exit direction being oriented substantially parallel to the layers of the printed circuit board; and
    a deflection element to deflect the light beam emitted by the semiconductor-based light source in a substantially perpendicular direction with respect to the layers of the printed circuit board, the deflection element being an optical module having a reflection unit and an optical lens.

2. The light signal transmitter as claimed in claim 1, wherein the deflection element is arranged in the structural space between the outer layers of the printed circuit board.

3. The light signal transmitter as claimed in claim 2, wherein one of the outer layers of the printed circuit board has an opening in a vicinity of the deflection element, for passage of deflected light from the deflection element.

4. The light signal transmitter as claimed in claim 3, wherein a transparent closure element is provided in the opening.

5. The light signal transmitter as claimed in claim 1, wherein
    the deflection element is arranged outside the structural space between the outer layers of the printed circuit board,
    the deflection element is arranged alongside the printed circuit board in the light exit direction, and
    the structural space between the outer layers of the printed circuit board has an end-side exit opening for passage of light from the semiconductor-based light source.

6. The light signal transmitter as claimed in claim 5, wherein a transparent closure element is provided in the end-side exit opening.

7. The light signal transmitter as claimed in claim 1, wherein the deflection element is a prism.

8. The light signal transmitter as claimed in claim 1, wherein the deflection element has a convex reflection surface to expand the light beam.

9. The light signal transmitter as claimed in claim 1, wherein
    the semiconductor-based light source is in contact with a heat dissipation contact area of the printed circuit board.

10. The light signal transmitter as claimed in claim 1, wherein
    the semiconductor-based light source is electrically connected to conductor tracks of the printed circuit board by bonding.

11. The light signal transmitter as claimed in claim 1, wherein the deflection element is a mirror.

12. The light signal transmitter as claimed in claim 1, wherein the deflection element has a concave reflection surface to concentrate the light beam.

13. The light signal transmitter as claimed in claim 1, wherein the semiconductor-based light source is electrically connected to conductor tracks of the printed circuit board by a plated-through hole.

14. The light signal transmitter as claimed in claim 1, wherein the semiconductor-based light source is electrically connected to contact areas of the printed circuit board by bonding.

15. The light signal transmitter as claimed in claim 1, wherein the semiconductor-based light source is electrically connected to contact areas of the printed circuit board by a plated-through hole.

16. A light receiver for an optical sensor, comprising:
    a multilayer printed circuit board formed from two outer layers and at least one inner layer, each layer extending in a plane such that the outer layers and the at least one inner layer are substantially parallel;
    a semiconductor-based light detector for detecting light, the semiconductor-based light detector being arranged in a structural space between the outer layers of the printed circuit board, the semiconductor-based light detector having a light-sensitive detector area oriented substantially perpendicular to the layers of the printed circuit board, to receive light travelling in a direction substantially parallel to the layers of the printed circuit board; and
    a deflection element to deflect incoming light toward the semiconductor-based light detector, from a direction substantially perpendicular to the layers of the printed circuit board, to a direction substantially parallel to the layers of the printed circuit board, the deflection element being an optical module having a reflection unit and an optical lens.

17. The light receiver as claimed in claim 16, wherein the semiconductor-based light detector is a CCD sensor.

18. The light receiver as claimed in claim 16, wherein the semiconductor-based light detector is a CMOS sensor.

19. A light signal transmitter for an optical sensor, comprising:
    a multilayer printed circuit board formed from two outer layers and at least one inner layer, each layer extending in a plane such that the outer layers and the at least one inner layer are substantially parallel;
    a semiconductor-based light source for generating light, the semiconductor-based light source being arranged in a structural space between the outer layers of the printed circuit board having an end-side exit opening for passage of light from the semiconductor-based light source, the semiconductor-based light source emitting a light beam in a light exit direction, the light exit direction being oriented substantially parallel to the layers of the printed circuit board; and a deflection element, arranged outside the structural space between the outer layers of the printed circuit board and alongside the printed circuit board in the light exit direction, to deflect the light beam emitted by the semiconductor-based light source in a substantially perpendicular direction with respect to the layers of the printed circuit board.

* * * * *